United States Patent [19]
Cain et al.

[11] Patent Number: 5,898,562
[45] Date of Patent: Apr. 27, 1999

[54] INTEGRATED DUAL FREQUENCY NOISE ATTENUATOR

[75] Inventors: Jeffery C. Cain, Surfside Beach, S.C.; John E. Barris, Worcester, Mass.

[73] Assignee: AVX Corporation, Myrtle Beach, S.C.

[21] Appl. No.: 08/853,598

[22] Filed: May 9, 1997

[51] Int. Cl.$^6$ .................................................. H01G 4/38
[52] U.S. Cl. ...................... 361/303; 361/329; 361/328; 361/320
[58] Field of Search .......................... 361/311–313, 320, 361/321.1, 321.2, 321.3, 321.4, 321.5, 328–330, 303–304, 301.2, 301.4; 29/25.42

[56] References Cited

U.S. PATENT DOCUMENTS

| | | |
|---|---|---|
| 2,758,256 | 8/1956 | Eisler . |
| 4,048,593 | 9/1977 | Zillman . |
| 4,074,340 | 2/1978 | Leigh . |
| 4,367,450 | 1/1983 | Carillo . |
| 4,470,096 | 9/1984 | Guertin . |
| 4,479,100 | 10/1984 | Moghe et al. . |
| 4,758,922 | 7/1988 | Ishigaki et al. . |
| 4,831,494 | 5/1989 | Arnold et al. . |
| 5,170,317 | 12/1992 | Yamada et al. . |
| 5,430,601 | 7/1995 | Burcham . |
| 5,430,605 | 7/1995 | deNeuf et al. . |
| 5,450,278 | 9/1995 | Lee et al. . |
| 5,583,738 | 12/1996 | Kohno et al. . |

*Primary Examiner*—Kristine Kincaid
*Assistant Examiner*—Anthony Dinkins
*Attorney, Agent, or Firm*—Dority & Manning, P.A.

[57] ABSTRACT

An integral dual frequency by-pass device is of one or more ceramic dielectric layers, the opposed surfaces of which are formed with electrodes of generally U-shaped configuration. The base portions of the electrodes are exposed at opposite surfaces of the monolith, the leg portions of the U-shaped electrodes extending toward the base portions of electrodes of opposite polarity. The overlap or registration area of one pair of legs differs from the overlap area of the other leg pair with the result that two capacitors of different values are formed, the capacitors being in parallel and accordingly defining low impedance path at two discrete frequencies. By varying the conductive paths as a function of the length of the electrode and/or the base of the U, a desired internal inductance is be developed.

12 Claims, 2 Drawing Sheets

INTEGRATED DUAL FREQUENCY NOISE ATTENUATOR

BACKGROUND OF THE INVENTION

1. Field of the Invention

The present invention is directed to a by-pass or attenuator device and more specifically to a miniaturized ceramic device intended to attenuate noise at two discrete frequencies. Without limitation, a particular utility of the device is as a noise attenuator in so-called dual mode cellular phones having both a digital and an analog output. In devices of this sort, where transmission is effected simultaneously on two discrete frequencies, it is desirable to minimize the "noise" generated by each of the two frequencies.

2. Prior Art

Conventional practice in respect of the recently developed dual mode cellular phones is to provide discrete LC networks tailored to attenuate (shunt to ground) the noise generated in the respective digital and analog transmission circuits. With the current trend to miniaturization, the requirement of utilizing discrete components to be attached to the motherboard is undesirable in that the multiple components occupy precious "geography".

Perhaps, more importantly, in the ultra high frequencies involved in cellular technology (900 MHz for analog transmissions and 1.9 GHz for digital transmissions) the inclusion of lead paths to the respective separate components results in a great variation in inductances, since the lead paths themselves function as inductors.

The references noted below were obtained as a result of a prior art search in respect of the instant invention.

U.S. Pat. No. 5,430,601 discloses a MLC which includes a resistance connection.

U.S. Pat. No. 5,170,317 discloses a MLC which includes, in addition to the conventional electrodes, a "correction" electrode which is narrower than the major electrodes to enable the provision of a capacitor having a precise value.

U.S. Pat. No. 4,758,922 discloses a U-shaped "strip line" which functions as a resonance element (capacitor) having ground plane layers and intervening dielectric layers.

U.S. Pat. No. 4,479,100 relates to an impedance matching network which includes a plurality of electrodes of different cross-sectional areas. The electrodes are connectable in parallel with a major electrode to provide a selected desired capacitance.

U.S. Pat. No. 4,074,340 discloses a MLC which includes adjusting electrodes extending to side surfaces of the monolith. Capacitance adjustment is effected by externally connecting or disconnecting the adjusting electrodes with the major electrodes.

U.S. Pat. Nos. 4,048,593 and 2,758,256 disclose the concept of providing a multiplicity of discrete capacitors formed on a single substrate.

SUMMARY OF THE INVENTION

The present invention is directed to a ceramic integrated dual frequency noise attenuator device. More particularly, the invention is directed to an attenuator device adapted to provide a low impedance path to ground at two discrete frequencies.

Still, more particularly, the invention is directed to a dual frequency by-pass device characterized in that the same is extremely simple to manufacture and provides accurate and precisely controlled dual LC circuits.

Still, more particularly, the invention is directed to a single or multilayer by-pass device especially adapted for noise filtration, the device comprising a pair of U-shaped electrodes in a monolithic ceramic dielectric structure. Each of the electrodes includes a base and a pair of leg portions extending from the base. In the monolithic structure each base is disposed at a margin of the monolith, the legs of each U being directed toward the base of the opposite U, the electrodes being disposed on opposite surfaces of the ceramic dielectric.

A characterizing feature of the device is that the overlapping area defined by one pair of legs differs from the overlapping area defined by the second pair of legs, such that two discrete capacitances are formed. The differential overlap may be achieved by one pair of legs being longer than the other pair or by one pair of overlapping legs being wider than the other pair, or by combinations of these factors.

A further characterizing feature of the invention resides in the composite of the branches of the U coupled with the base of the U functioning as an inductor whereby the device, by the provision of the U-shaped electrode combination described, inherently provides a circuit comprised of two capacitors of different values connected in parallel, in series with a pair of inductors defined by the electrodes which also form the capacitance together with the base portions of the U configurations. Where the differential capacitance is provided by the overlapping legs being longer on one side of the U than the legs of the opposite side of the U, there will inherently be provided a proportionately greater inductance due to the longer conductive path of the longer legs.

A further feature of the invention resides in the ability, due to the U-shaped configuration of the electrodes, to increase the inductance by elongating the base of the U, whereby it is feasible to provide an increased inductance without materially increasing the capacitance.

The device of the invention provides a compact and readily manufactured component providing optimal by-pass and noise reduction in a single chip having but two leads (surface-mount or wire) to be connected to the motherboard. By minimizing the external conductive path, a great degree of control of the characteristics of the by-pass device is achieved. This is in contrast to by-pass techniques employing discrete capacitors and inductors which inherently require elongated conductive paths on the PC board and, hence, greater and less controlled inductances.

In accordance with the invention it is an object to provide a readily manufactured integral chip device especially adapted to function as a by-pass or noise reducing device for two discrete frequencies.

A further object of the invention is the provision of a device of the class described wherein the capacitive and inductive values may be precisely determined, the device being compatible with the desired highly efficient use of the geography of the motherboard.

DETAILED DESCRIPTION OF DRAWINGS

Figure 1A:
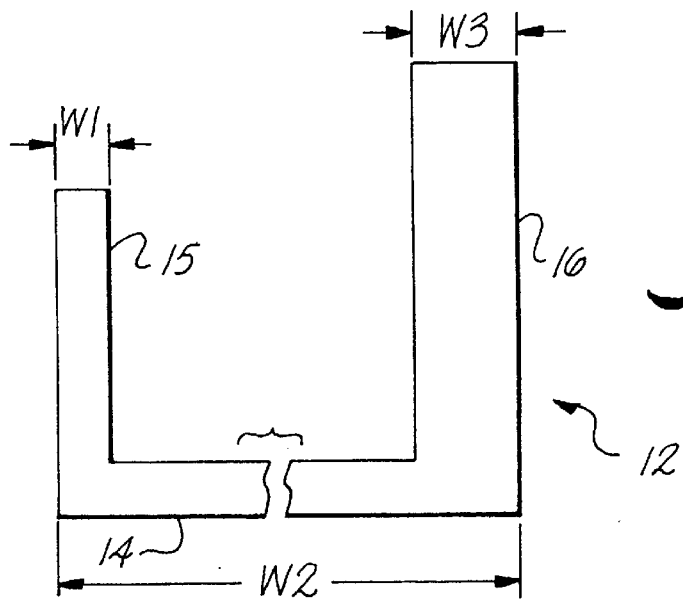
FIGS. 1a and 1b are respectively plan views of the top and bottom electrodes of a device in accordance with the invention.
Figure 1B:
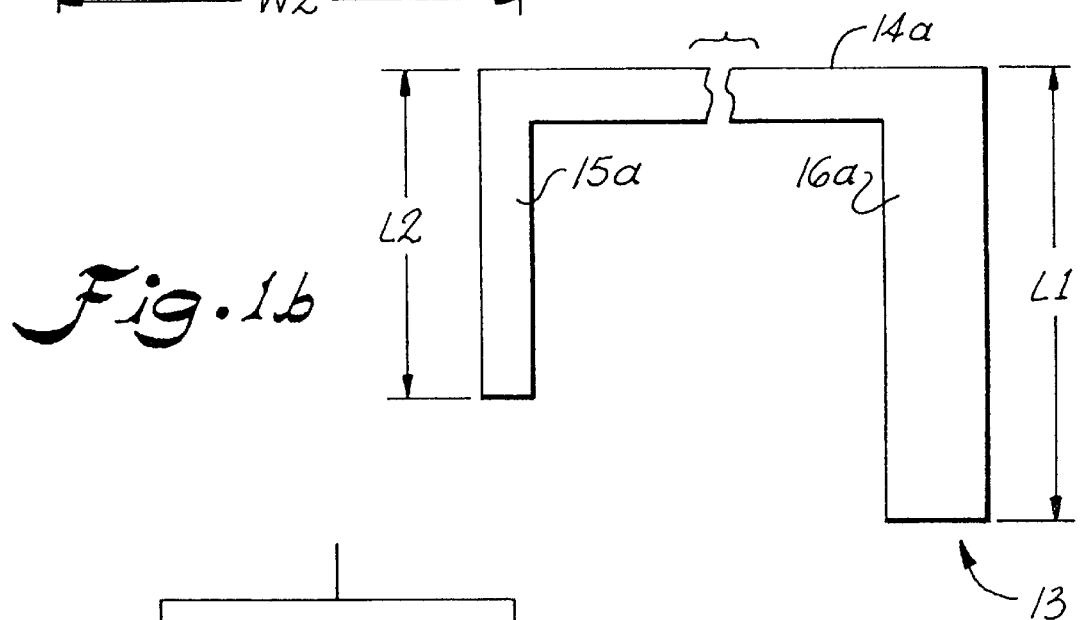
Figure 3:
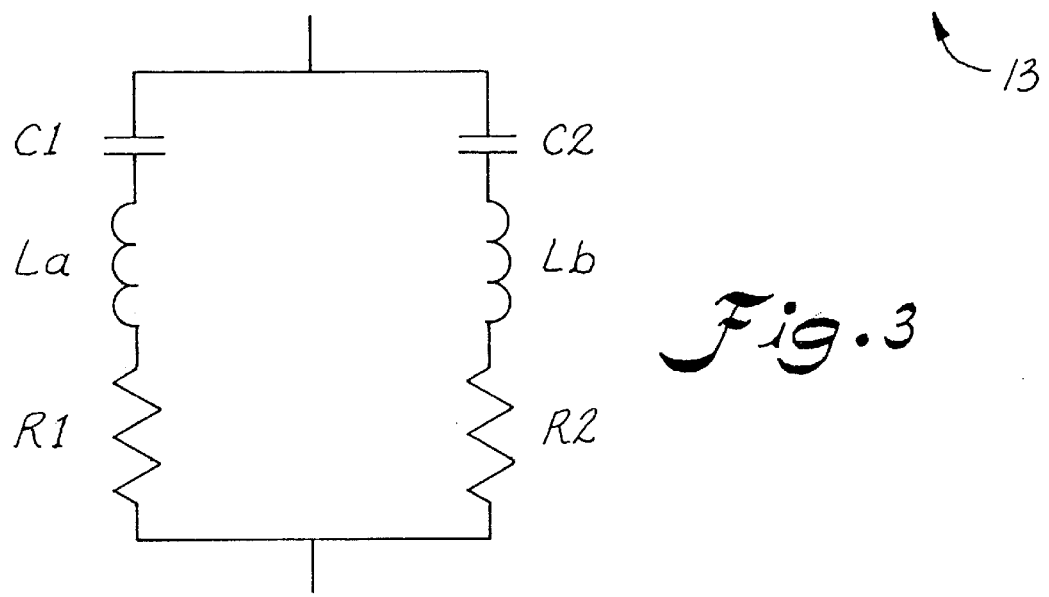
FIG. 3 is a diagram of the circuitry defined by the device of the invention.
Figure 2:
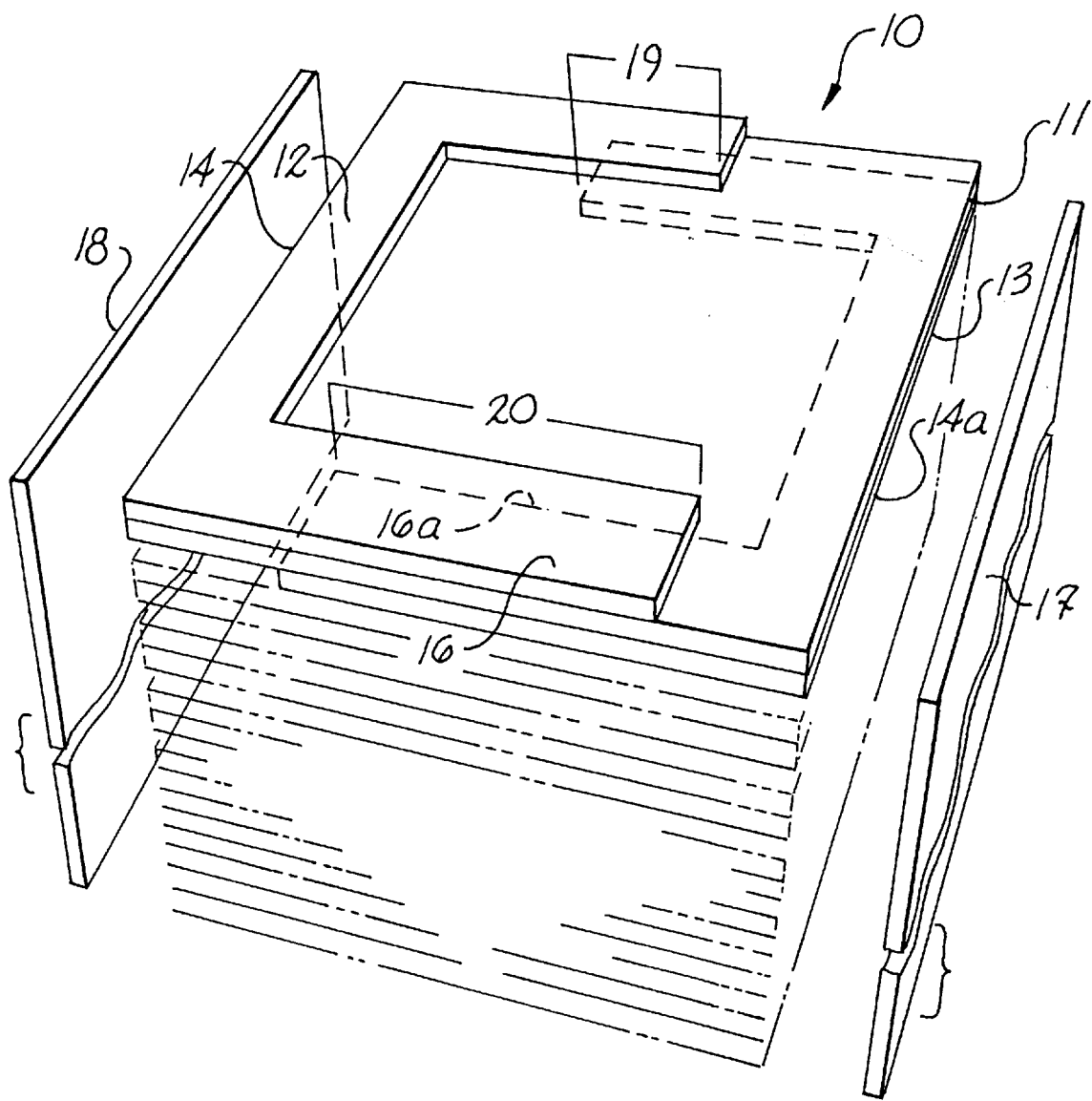
FIG. 2 is a schematic exploded perspective view of the device of the invention.

Referring now to the drawings, there is shown in FIG. 2 a schematic exploded perspective of a device in accordance with the invention, the dimension and thickness of the various elements being greatly increased to facilitate an understanding of the structure.

The by-pass device 10 is comprised of a ceramic monolith including one or more dielectric layers 11, the opposite surfaces of which have formed thereon U-shaped upper and lower electrodes 12 and 13. Electrode 12 includes a base portion 14 having legs 15 and 16 projecting from the opposite ends. Electrode 13 includes a base portion 14a from the opposite ends of which project leg portions 15a and 16a.

As best seen in FIG. 2 electrodes 12 and 13 are disposed respectively above and below dielectric 11 in such manner that the respective base portions 14–14a are exposed at opposite edges of the monolith. As will be appreciated from FIG. 2 wherein a single unit comprised of upper and lower electrodes and an intervening dielectric layer are shown in solid lines, any number of layers may be formed in the stacked monolith to achieve the desired values of capacitance and inductance.

Terminations 17–18 are formed at the end margins of the monolith, the termination 17 being electrically coupled to the base portions 14a of the electrodes 13 and termination 18 being electrically coupled to the base portion or portions of electrodes 12 of the monolith.

As is evident from FIG. 2, due to the smaller width and lengths L2 of legs 15 and 15a the registering or overlapping area 19 defined by the legs 15–15a will be less than the overlapping area 20 defined by longer and wider legs 16–16a whose length is represented by the notation L1.

The capacitance defined in the area 19 will be less than the capacitance defined in the area 20, since capacitance is directly proportional to the areas of overlap. It will thus be appreciated that the desired capacitive differential between capacitor C1 defined by overlapping areas 19 from the larger capacitance C2 defined by overlapping areas 20 can be achieved by varying the width of the respective overlapping leg components or by varying the length of the overlapping components or by both expedients.

Particularly desirable is adjusting capacitance in accordance with the length of the overlapping legs, since the inductance provided is a function of the entire length of the conductive path and thus by utilizing legs of different lengths there is inherently provided a larger inductance where the leg lengths are longer whereby the inductance value is automatically greater to interact with the larger capacitance.

Methodology

The manner of fabrication of the by-pass device is identical to the conventional methods of fabricating ceramic capacitors. Since this methodology is well known to those skilled in the art it will be merely briefly described below.

The dielectric components are formed by casting a thin layer of a slurry of finely divided dielectric forming material such as barium titanate suspended in a liquid matrix including binder. The "green" ceramic is screen printed with electrode forming ink in the desired U-shaped patterns. Typically, the ink will include a noble metal, such as palladium. Patterned green ceramics are superposed to provide the desired number of layers, the patterns of adjacent layers being coordinated to achieve the desired overlapped condition. Individual units are diced from the superposed layers in such manner as to expose base portions 14–14a at opposite ends of the pre-fired chips. The diced units are thereafter subjected to binder burn-off at a first temperature and thereafter sintered at a higher temperature to define the monolith.

Terminations 17–18 are applied to the respective exposed base portions 14 at one end and 14a at the other end. Terminations may be formed in any of a number of known manners including vapor deposition to provide electrical and mechanical bond to the exposed electrode bases at opposite ends of the monolith followed by application of one or more metallic layers over the sputtered layer to enable soldering to the motherboard. The terminations may extend beyond the end margins where surface mounting is desired. Alternative termination methods include applications of carbon followed by an outer silver layer with or without intervening metallic layers between carbon and silver.

EXAMPLE

Without limitation, and in compliance with the "best mode" requirements of the patent laws of the United States, a specific example of an assembly in accordance with the invention is provided below.

A monolith is formed utilizing 16 active layers of a barium titanate ceramic approximately 20 micron thickness. In such example, seventeen active electrodes are employed. In the example provided, the widths W1 of the legs 15 and 15a and the widths W3 of the legs 16 and 16a are identical and comprise 0.007 inches. The length of the branch W2 between legs W1 and W3 is also 0.007 inches. The length L1 of legs 16,16a is 0.050 inches with the length of legs L2 being 0.035 inches. The electrodes are stacked such that the overlap or registering area 20 of legs 16,16a is substantially three times the overlap area 19 of legs 15,15a.

A batch of the described components was tested, the capacitance C1 defined by overlap area 20 being approximately 47 picofarad and in the capacitance C2 defined by area 19 being approximately 15 picofarad. Inductance La is approximately 800 picohenry, inductance Lb was measured at approximately 600 picohenry.

Preferably, the two capacitive values should be at least a half a decade apart. In the illustrated example, the resistances R1 and R2 were each approximately 200 Ω. Obviously, by tailoring the overlap area a wide diversity of capacitor values may be achieved. Similarly, by modifying the length and the width of the electrode legs and base, the desired inductances may be tailored to fit specific situations. The values of the illustrated example have been found highly efficient as by-pass devices for dual mode cellular phones operating on respective analog and digital frequencies of 900 MHz and 1.9 GHz. Of particular advantage is the predictable nature of the inductance as contrasted with the large variations resulting from the utilization of separate capacitors with the attendant variations in path lengths of the leads between the capacitors.

As will be apparent to those skilled in the art who have been familiarized with the instant disclosure, numerous variations in details of construction may be derived without departing from the spirit of the invention. Accordingly, the invention is to be broadly construed within the scope of the appended claims.

We claim:

1. An integrated ceramic dual frequency by-pass device including a parallel connected pair of ceramic capacitors of disparate values, each capacitor including a series connected inductance comprising at least one planar dielectric layer, a first electrode and a second electrode disposed on respective opposite surfaces of said dielectric layer, said first electrode and said second electrode each being of generally U-shape and including a base portion and a pair of leg portions extending from said base portion, said base portion of said first electrode being disposed at an opposite end of said dielectric layer from said base portion of said second electrode, said leg portions of each of said first electrode and said second electrode extending toward said base portion of the other, each of said leg portions of said first electrode being disposed in registry with an area of respective said leg portions of said second electrode, the areas of registration being of different values whereby a capacitance defined between a first registering pair of said leg portions differs from a capacitance defined between a second registering pair of said leg portions.

2. A device in accordance with claim 1 and including first and second terminations at opposite ends of said dielectric layer, each of said first and second terminations being electrically connected to a respective said base portion of said first electrode and said second electrode.

3. A device in accordance with claim 2 wherein said lea portions and said base portion of said first and second electrodes defines a respective inductance of predetermined value.

4. A device in accordance with claim 1 wherein a first of said leg portions has a length greater than a second of said leg portions.

5. A device in accordance with claim 1 wherein a first of said legs portions has a width greater than a second of said leg portions.

6. A device in accordance with claim 1 wherein a first of said leg portions has a length and width greater than a second of said leg portions.

7. A device in accordance with claim 1 comprising a multilayer stacked configuration having a plurality of dielectric layers each having a respective first electrode and a second electrode on opposite surfaces thereof, each said first electrode being connected in parallel with each other and each said second electrode being connected in parallel with each other.

8. An integrated ceramic by-pass device providing a pair of parallel-connected ceramic capacitors of disparate capacitor values in a single component package, said device comprising:

a device body having a first polarity termination and a second polarity termination located on respective opposite ends thereof;

said device body comprising a plurality of dielectric layers, each dielectric layer having a first pair of leg portions extending from said first termination on a top surface thereof and a second pair of leg portions extending from said second termination on a bottom surface of said dielectric layer;

one of said first leg portions overlapping a corresponding one of said second leg portions to define a first predetermined capacitance value; and another of said first leg portions overlapping a corresponding other of said second leg portions to define a second predetermined capacitance value, whereby first and second parallel capacitors of said disparate capacitance values are provided.

9. An integrated ceramic by-pass device as set forth in claim 8, wherein said first pair of leg portions are interconnected by a first base portion and said second pair of leg portions are interconnected by a second base portion.

10. An integrated ceramic by-pass device as set forth in claim 8, wherein:

said one of said first leg portions has a length greater than said another of said first leg portions; and said corresponding one of said second leg portions has a length greater than said corresponding other of said second leg portions.

11. An integrated ceramic by-pass device as set forth in claim 8, wherein:

said one of said first leg portions has a width greater than said another of said first leg portions; and said corresponding one of said second leg portions has a width greater than said corresponding other of said second leg portions.

12. An integrated ceramic by-pass device comprising:

a device body having a first polarity termination and a second polarity termination located on respective opposite ends thereof;

said device body comprising a plurality of dielectric layers, each dielectric layer having a first pair of leg portions extending from said first termination on a top surface thereof and a second pair of leg portions extending from said second termination on a bottom surface of said dielectric layer;

one of said first leg portions overlapping a corresponding one of said second leg portions to define a first predetermined capacitance value;

another of said first leg portions overlapping a corresponding other of said second leg portions to define a second predetermined capacitance value; and wherein a first area of overlap defined by said one of said first pair of leg portions and said corresponding one of said second pair of leg portions is substantially three times a second area of overlap defined by said another of said first pair of leg portions and said corresponding other of said second pair of leg portions.

* * * * *